United States Patent [19]

Sydney et al.

[11] Patent Number: 5,457,385
[45] Date of Patent: Oct. 10, 1995

[54] NQR METHODS AND APPARATUS

[75] Inventors: John A. Sydney, London, England; Julian D. Shaw, Encinitas, Calif.

[73] Assignee: British Technology Group Limited, London, England

[21] Appl. No.: 122,545

[22] PCT Filed: Apr. 1, 1992

[86] PCT No.: PCT/GB92/00577

§ 371 Date: Sep. 30, 1993

§ 102(e) Date: Sep. 30, 1993

[87] PCT Pub. No.: WO92/17793

PCT Pub. Date: Oct. 15, 1993

[30] Foreign Application Priority Data

Apr. 2, 1991 [GB] United Kingdom .................... 9106789

[51] Int. Cl.⁶ ........................................................ G01V 3/00
[52] U.S. Cl. ............................................. 324/301; 324/300
[58] Field of Search .................................. 324/300, 301, 324/307, 309, 318

[56] References Cited

U.S. PATENT DOCUMENTS

| | | | |
|---|---|---|---|
| 4,166,972 | 9/1979 | King et al. | 324/309 |
| 4,514,619 | 4/1985 | Kugelman | 219/483 |
| 4,514,691 | 4/1985 | De Los Santos et al. | 324/301 |
| 4,825,162 | 4/1989 | Roemer et al. | 324/318 |
| 4,887,034 | 12/1989 | Smith | 324/307 |
| 4,908,578 | 3/1990 | Van Liere | 324/309 |
| 5,233,300 | 8/1993 | Bvess et al. | 324/300 |

FOREIGN PATENT DOCUMENTS 0404549 12/1990 European Pat. Off. .
0426851 5/1991 European Pat. Off. .
2159626 12/1985 United Kingdom .
2200462 8/1988 United Kingdom .

OTHER PUBLICATIONS

WO,A,84/04173 (Southwest Research Institute) 25 Oct. 1984 see p. 4, line 34–p. 6, line 28; see page 19, line 12–line 31.

Journal of Magnetic Resonance, vol. 92, No. 2, 1 Apr. 1991, Orlando, Minn. US pp. 348–362; M. L. Buess et al "NOR Detection Using a Meanderline Surface Coil" see p. 2, line 1–line 33.

Electro Conference Record, vol. 4,24 Apr. 1979, Los Angeles, Calif. US, pp. 1841–1845 J. R. Gonano, "Nuclear Magnetic Resonance . . . " see the whole document.

*Primary Examiner*—Louis Arana
*Attorney, Agent, or Firm*—Cushman, Darby & Cushman

[57] ABSTRACT

A method for detecting the presence within a larger article of a specific substance containing quadrupolar atomic nuclei includes performing tests of parts of the article by placing the article adjacent to an array of coils (10), energizing with an rf source (20) the coils (10) in periods within a cyclic sequence to irradiate parts of the article with rf pulses of one or more frequencies at or close to a resonant frequency of quadrupolar atomic nuclei within the substance to be detected, connecting the coils (10) in other periods within the cyclic sequence to a phase-sensitive detecting and measuring circuit (15, 24–26) to measure response signals due to nuclear quadrupole resonances, and summing the response signals detected at corresponding instants over a number of cyclic sequences. Apparatus for detecting the presence of a specific substance analogous to the above method is also disclosed.

37 Claims, 6 Drawing Sheets

NQR METHODS AND APPARATUS

FIELD OF THE INVENTION

This invention relates to methods and apparatus for detecting the presence of specific substances containing quadrupolar atomic nuclei, in larger articles, by direct observation of nuclear quadrupole resonance (NQR) effects.

BACKGROUND OF THE INVENTION

Quadrupolar nuclei have nuclear spin quantum numbers greater than one half. Common nuclei of this Kind include $^{7}Li$, $^{9}Be$, $^{11}B$, $^{14}N$, $^{23}Na$, $^{27}Al$, $^{35}Cl$, $^{39}K$, $^{55}Mn$, $^{59}Co$, $^{75}As$, $^{79}Br$, $^{81}Br$, $^{127}I$, $^{197}Au$, $^{209}Bi$ and many others—this list should not be interpreted in any limiting way, it is given simply to note the potential range of substances which might be detectable by this technique.

In the sub-molecular environment of compounds or crystals, the nature and disposition of the adjacent electrons and atomic nuclei produce electric field gradients which modify the energy levels of any quadrupolar nuclei, and hence give rise to transition frequencies, to such an extent that measurements of these transition frequencies and/or relaxation time constants can indicate not merely the nuclei which are present but also their chemical environment.

NQR measurements have the great advantage that they do not require the sample to be placed in a strong magnetic field, and therefore do not require the large, expensive and sample-size limiting magnet structures which are needed for nuclear magnetic resonance (NMR) measurements. It should be noted that the rules governing NQR effects are so significantly different from the rules controlling NMR effects that practices and principles established in NMR studies do not necessarily apply in NQR work.

United Kingdom Patent Application No. GB-A-2159626 discloses a nuclear magnetic resonance spectrometer comprising: a means for producing a static magnetic field; a plurality of transmitter/receiver coils placed in the magnetic field; a means for repeatedly producing an RF pulse containing the resonance of a nuclide to be observed; a switching means for allowing the RF pulses to be successively supplied to the coils and applied to a sample under examination; a receiver circuit for picking up the resonance signals detected by the coils after the application of the RF pulses; and means for separately storing the data about the picked up resonance signals for the different coils. Means is also provided for moving the sample relative to the coils, or vice versa.

U.S. Pat. No. 4,887,034 describes methods by which the presence of various drugs or explosives may be detected indirectly through the interaction of NQR and NMR effects, but these methods require a strong magnetic field and the presence of NMR nuclei as well as quadrupolar nuclei in the substances to be detected. The strong magnetic field would require relatively large magnets with the added complication that the magnetic field has to be varied between strong and weaker values.

SUMMARY OF THE INVENTION

According to the present invention, there is provided a method of detecting the presence of selected nuclei in an article, including providing an array of excitation devices (preferably coils), causing relative motion between the article and the array in a given direction, and applying excitation pulses to the article via the array to excite the selected nuclei to resonance and detecting via the array the resonance responses thus excited, the excitation devices in the array being disposed such that if viewed in the given direction they would appear to overlap one another.

Hence, if the article is moved in he given direction past the array of excitation devices, a part of the article which passes adjacent the side of one excitation device can be arranged to pass adjacent the center of another excitation device.

The present invention also provides a method for detecting the presence within a larger article of a specific substance containing quadrupolar atomic nuclei wherein tests of parts of the article are performed by placing the article adjacent to an array of coils, energizing the coils in periods within a cyclic sequence to irradiate parts of the article with radio frequency pulses of one or more frequencies equal or close to a resonant frequency of quadrupolar nuclei within the substance to be detected, connecting the coils in other periods within the cyclic sequence to a phase-sensitive detecting and measuring circuit to measure response signals due to nuclear quadrupole resonance, and summing the response signals detected at corresponding instants over a number of cyclic sequences.

Because only a part of the article has to be irradiated at any given time, the radio frequency drive power required can be greatly reduced over the case where only one coil is provided to irradiate all of the article. At the same time, the sensitivity of detection can be increased due to the fact that smaller volumes of the article are irradiated. Energizing the coils in periods within a cyclic sequence can afford the advantage that the test time need be no longer than if only one coil were used. The minimum cycle time is generally limited by the spin-lattice relaxation time, $T_1$, of the nuclei. If energization is supplied to all of the coils within this minimum cycle time, the overall test will take no longer than if only one coil were used, since the arrangement with one coil is still subject to the same cycle time limitation.

Preferably the article is placed between two identical arrays of coils, and corresponding coils in both arrays are simultaneously excited and simultaneously connected to the detecting and measuring circuit. Alternatively the two arrays can be used in separate tests, and any difference in the results may show that the substance is present towards one side of the article.

In one preferred embodiment, a coil is energized with at least one radio frequency pulse and after a set delay time it is connected to a detecting and measuring circuit to measure a free induction decay response induced by the or each pulse, and similar tests are applied to each coil to complete each cyclic sequence.

Preferably, the tests are interleaved in time, by energizing another coil or other coils in sequence during the delay time after a coil is energized.

Preferably, the radio frequency phase of the energizing pulses is inverted in one half of the pulses and a suitable phase-sensitive detection method is used to cancel out residual ring-down signals.

In another preferred embodiment, the pulses applied to each coil form a series of pulses controlled so as to produce spin-echo signals and the measuring circuit is arranged to measure the spin-echo signals.

Preferably, the pulses applied to each coil form a series commencing with a first pulse of a predetermined reference phase, a first interval of duration $\tau$, and subsequent pulses separated by intervals of duration $2\tau$ (preferably of different phases from the reference phase).

Preferably, the subsequent pulses are in quadrature with the reference phases.

Preferably, the subsequent pulses are alternately in phase-advanced and phase-retarded relationship with respect to the reference pulses.

Preferably, in one-half of the cycles used for detection and measurement the phase of the energization is substantially inverted with respect to the phase of the energization in the other half of the said cycles.

In another preferred embodiment, the tests are interleaved in time, the coils being energized consecutively in a set sequence and then connected consecutively to the detecting and measuring circuit in the same sequence during each pulse interval except the first interval of the series.

The method may be repeated with different frequencies appropriate for the detection of different substances, say, specific drugs or explosives. The timing, duration and frequency range or spectrum of the excitation pulses and the timing and duration of the sampling periods may have to be altered for optimum sensitivity in the detection of different substances. It is of particular interest to detect the resonances of $^{14}N$ nuclei in drugs, for instance heroin or cocaine, or in explosives, for instance HMX, RDS, PETN, or TNT, and the above parameters may be set to values appropriate for the detection of specific drugs or explosive substances.

The irradiation frequency should be within about 0.1% of the resonant frequency. Environmental conditions such as temperature, pressure or magnetic fields magnetic fields may shift such as frequency and it is therefore desirable to modulate or vary the irradiation frequency or alternatively to ensure (e.g. by the use of high-power or composite pulses) that the power spectrum of the irradiation pulses provides substantial power within about 0.1% of any frequency to which the resonance may be shifted by any environmental conditions likely to apply to the articles to be examined. In the examination of airline baggage or air freight, for instance, it will be desirable to allow for resonant frequency shifts which may be caused by ±20° C., preferably ±25° C., temperature variations, and in a typical case these shifts may be about ±10 kHz. Hence, preferably the power spectrum of the irradiation pulses provides substantial power within about 0.1% of any frequency to which the resonance may be shifted by any environmental condition likely to apply to the article. Preferably also, the irradiation pulses allow for resonance frequency shifts caused by ±20° C. temperature variations.

It is also desirable to monitor the loading or matching of the coils to detect the presence of any conducting or ferromagnetic material which could significantly affect the operation of the apparatus or screen the substance from the radio frequency irradiation.

The present invention also provides apparatus for detecting the presence within a larger article of a specific substance containing quadrupolar atomic nuclei comprises an array of coils adjacent to a sample space in which the article can be placed, excitation means for applying phase-controlled pulses or pulse sequences of radio frequency signals sequentially to the coils so as to irradiate parts of the article with pulses of radio frequency energy having a frequency or a range of frequencies at or close to a resonant frequency of the nuclei in the substance to be detected, a radio frequency detecting and measuring circuit, switching means for sequentially connecting the coils to the detecting and measuring circuit so that each such connection is made before and is maintained throughout a sampling period at a set time interval after the application of an excitation pulse to the relevant coil, and means for summing signals detected at corresponding instants in the sampling periods of a number of cycles of irradiation and detection.

Preferably the coils of the array are arranged in two or more columns and some means is provided to move, or facilitate the movement of, articles to be examined past the array transversely to the columns. The coils of alternate columns are preferably displaced so that any part of an article which passes adjacent to the sides or abutment of two coils in one column will pass adjacent to the center of a coil in the next column. Alternatively this effect may be achieved by having coils in a diagonal array. Hence, preferably the apparatus includes means for conveying articles to be examined through the sample space in an intermittent motion or a slow continuous motion, and the coils are arranged in two or more columns transverse to the direction of motion, the coils of alternate columns being displaced so that any part of an article which passes adjacent to the edges or abutment of two coils in one column will pass adjacent to the center of a coil in the next column. Again, the apparatus preferably includes means for conveying articles to be examined through the sample space in an intermittent motion or a slow continuous motion and the coils are disposed in a diagonal or staggered array to test overlapping parts of each article when it is moved past the coils.

Preferably the apparatus will have two identical arrays of coils placed on opposite sides of the sample space, and corresponding coils on both sides will be used simultaneously for both excitation and detection. Thus, preferably, the excitation means is arranged to apply the radio-frequency signals simultaneously to corresponding coils in both arrays, and the switching means is arranged to connect corresponding coils in both arrays simultaneously to the detecting and measuring circuit. This gives more uniform irradiation and hence more uniform sensitivity.

The apparatus may be made in three sizes—a relatively small size for the examination of letters and small packages, a medium size for the examination of hand luggage, larger packages and parcels, and a large size for the examination of large suitcases and other baggage. Practically the spacing (w) between the coil arrays will be most important since it will determine the thickest article which can be tested with the normal position of both coil arrays and it will indirectly determine the radio frequency drive power required. One coil array may be movable or removable, to allow some testing of thicker articles.

To achieve fairly uniform irradiation and hence fairly uniform sensitivity, the corresponding coils of the two arrays may be of the Helmholtz configuration, that is annular coils of radius w separated by the distance w and therefore enclosing and irradiating a volume of $\pi w^3$ with a very uniform field strength. If more but smaller coils are used to cover the required height of sample space, the r.f. drive power required will be reduced but the field strength will be less uniform and this will give less uniform sensitivity.

For more efficient coverage of the whole volume of the article, the coils may have turns of a hexagonal or square rather than circular shape. To reduce the required drive power rectangular coils of height h and breadth b may be used, where h is comparable with w and b is smaller than h. For the purpose of detecting articles which contain significant quantities of specific substances, although it is desirable to achieve uniform sensitivity throughout the sample volume, it is not absolutely essential and consequently a less uniform radio frequency field may be used. It has been reported that the use of phase inversion on alternate pulses in some way compensates for effects of a non-uniform radio frequency field strength. Thus h may be reduced to about 0.7 w to give a further saving in the drive power required. The coils may be short solenoids of one or more layers, or may be formed by one or more spiral turns on planar or conical support structures.

A preferred design for a typical coil has two spiral windings of square configuration mounted on respective opposite sides of a planar support and electrically connected in parallel. The spirals may be relatively displaced so that in a side view one spiral winding would appear to lie between the turns of the other, to minimize their self-capacitance.

Material used to support the coils should be a low-loss insulating material which will not show any nuclear quadrupole resonance which might be confused with or mask the resonance signals from any substance which is to be detected. Each coil will be connected to timing or matching components to minimize r.f. signal reflections.

Each coil may have some outer turns enclosing a relatively large area and some inner turns enclosing a concentric relatively small area, connected so that the field of the inner turns will oppose the field of the outer turns. This form of coil will use more power for a given strength of irradiation but will provide more uniform irradiation over a greater distance from the face of the coil.

In the simplest form of the invention the cycle time may be made much longer than the spin-lattice relaxation time constant $T_1$ of the nuclei and the response signals which are measured are parts of the free induction decay (f.i.d.) signals generated immediately after each Irradiation pulse. In effect the cycle time may be sufficiently long that the nuclei have time to return to a steady state and the tests are separate and independent. Inevitably the radio frequency pulses applied to the coils will tend to persist as a decaying damped oscillation. This has two consequences; it requires the measuring actions to be delayed until the damped oscillations have sufficiently decayed to avoid overloading the detection circuits, and the residual oscillation signal will be superimposed on the wanted response signals. However, by having the radio-frequency pulses phase-inverted in one-half of the cycles and by using suitable phase-sensitive detector circuits as hereinafter described, the residual oscillations can be made to cancel out substantially. Since the free induction decay signals are also decaying, it is desirable not to delay the measurements any longer than is necessary.

Resonant frequencies appropriate for the detection of different substances may lie anywhere in the range from 50 kHz to 1000 MHz. The optimum physical form of the coils and the maximum Q factor which they may have will depend on the frequency or frequencies to be used. It has been found advantageous to use 0 coils of the highest available Q factor.

Generally a Q factor of 40 or more will be possible and preferable and coils of Q factor=100 or more have been used in experiments. Such coils will show a decaying r.f. oscillation or ring-down after each excitation pulse, and the higher the Q, the longer this ring-down will persist.

The ring-down signals may be suppressed or reduced by Q-switching arrangements which may use PIN diodes or other controllable switching devices to dissipate the ring-down signal energy quickly after each excitation pulse, thereby allowing the sampling delay $t_D$ to be shortened and higher response signals to be measured. This may be used instead of or in addition to phase-inverting half the irradiation pulses. However, it may be difficult to provide a Q switching arrangement which will be reliable in apparatus using the amount of radio frequency drive power which will be needed for the detection of drugs or explosives hidden in moderately large articles.

However in the simplest form of the invention the total cycle time is not critical. The f.i.d. response signals can be sampled during sampling periods of arbitrary duration and they can be accumulated and measured as analog signals by a box-car integrating circuit. It may be most convenient to test parts of the article in a simple sequence in which a coil or coil pair is excited by a radio frequency pulse or pulse sequence, there is a set delay time (in which any Q-switching action may be applied) and then the free induction decay response superimposed on the residual decaying oscillation is applied to the phase-sensitive detecting and measuring circuit, this sequence being repeated for the next coil or coil pair and so on until all the coils have been used. The tests may be interleaved in time to some extent, for instance by exciting the second coil or coil pair in the set delay time for the first coil, but it would be impractical to attempt any measurements on one coil while any excitation or any Q switching actions are being applied to any other coil. Hence interleaving will shorten the periods available for sampling and measuring, and if very short sampling periods are to be used it may be necessary to resort to fast digital sampling and signal processing.

In certain experimental conditions the cycle time or time between pulses applied to the same coil may be made very much shorter than $T_1$ and substantial free induction decay responses can still be obtained after each of a long succession of pulses. For instance in an experiment with a sample of RDX explosive using a slightly off-resonance excitation frequency of 5.191 MHz and a pair of coils similar to FIG. 9 the cycle time was reduced to 2 milliseconds and substantial f.i.d. responses were measured in each of a long succession of cycles.

In another form of the invention the cycle time is reduced to a duration comparable with or shorter than the spin-spin relaxation time $T_2$ of the quadrupolar nuclei in the substance to be detected, and the response signals which are measured are spin-echo signals consequential on the application of two or more preceding pulses.

The pulses applied to each coil or coil pair must form a series in which the durations, power, intervals, frequencies and relative phases of the radio frequency pulses are controlled so as to produce substantial or optimized spin-echo signals from the substance to be detected if it is present in the article being tested. A preferred form for each series of pulses commences with a pulse of duration $t_p$ and r.f. phase 0°, then an interval $\tau$ and then pulses of duration $t_p$ with pulse intervals $2\tau$, the r.f. phase in these pulses being alternately 90° and 270°. The spin echo responses should occur at a time $\tau$ after each of the 90° and 270° pulses. However there are various other pulse sequences, including for example composite sequences with no delays between pulses, which can produce useful results. The r.f. phases used may be optimized experimentally.

The pulse interval $2\tau$ and pulse duration $t_p$ and hence the cycle time must be limited if they are too long the spin echo responses become smaller very quickly, but when appropriate time and appropriately off-resonant pulses are used substantial response signals can be measured after each of a long succession of excitation pulses. Because the cycle time is so limited the tests have to be interleaved in time; all the coils or coil pairs are energized in sequence in the first half of each cycle and their responses are sampled and measured in sequence during the second half of the cycle. The periods available for sampling and measuring will be relatively short. It may be possible to use analog signal measurements but the periods may be so short that fast digital sampling may become necessary or preferable. However the spin-echo responses may often provide a better signal-to-noise ratio than the free induction decay signals. The much shorter cycle time and the interleaving of the tests in this form of the invention will allow a complete examination to be done comparatively quickly.

The duration $t_p$ of each irradiation pulse is preferably optimized. It can be theoretically shown that the optimum pulse duration which maximizes the response signals is inversely proportional to the radio frequency field strength. Hence the optimum pulse length can be reduced by increasing the radio frequency drive power, but this must be increased in proportion to the square of the field strength.

To allow for the interleaving of the irradiation and detection sequences and to make the sampling periods coincide with the spin-echo response peaks, if there are n coils in the array then the sampling periods cannot be longer than $\tau/(n-½)$ and the excitation pulse duration should be preferably slightly shorter. It will be convenient to make the excitation pulse length $t_p$ approximately equal to $\tau/n$ and to have a short time between the last excitation pulse and the first sampling period.

It will therefore be desirable to make the radio frequency field strength large enough so that this pulse duration $\tau/n$ will be equal to, or not much less than, the optimum.

It can be shown theoretically that the response signal strength will vary as the first order Bessel function $J_1(\theta_p)$, where $\theta_p$ is proportional to $t_p$, which has its first maximum at $\theta_p=119°$ for I=1 and a powdered sample. It follows that if the r.f. field strength is reduced to a value which would make the optimum pulse length equal to 1.5 $\tau/n$ but the pulse length actually used is $\tau/n$, the spin-echo responses will be reduced by about 13%, while the r.f. drive power required will be only four-ninths of the drive power needed to optimize the spin echo responses.

The detected signals in each sampling period will include some residual contributions from the damped decaying oscillation or "ring-down" of the excitation signal as well as any resonant emission from the nuclei, but with phase inversion applied to alternate excitation pulses and with a suitable phase-sensitive quadrature detection and measuring system, these residual signals may be cancelled out. To allow for possible stray phase shifts, the 90° and 270° phase shifts may be empirically adjusted for best results.

The invention extends to a method of detecting the presence of selected nuclei in an article, including applying a respective sequence of excitation pulses to the article via each of a plurality of excitation devices to excite the selected nuclei to resonance, the sequences of pulses being interleaved with one another, and detecting the resonances thus excited.

The invention also extends to apparatus for detecting the presence of selected nuclei in an article, comprising a plurality of excitation devices (preferably coils), means for applying a respective sequence of excitation pulses to the article via each of the excitation devices to excite the selected nuclei to resonance, the sequences of pulses being interleaved with one another, and means for detecting the resonances thus excited.

All of the method and apparatus features described above apply to these aspects of the invention, and vice versa.

BRIEF DESCRIPTION OF THE DRAWINGS

Embodiments of the invention will now be described, by way of example only, with reference to the accompanying Figures, of which.

DESCRIPTION OF PREFERRED EMBODIMENTS

Figure 1:
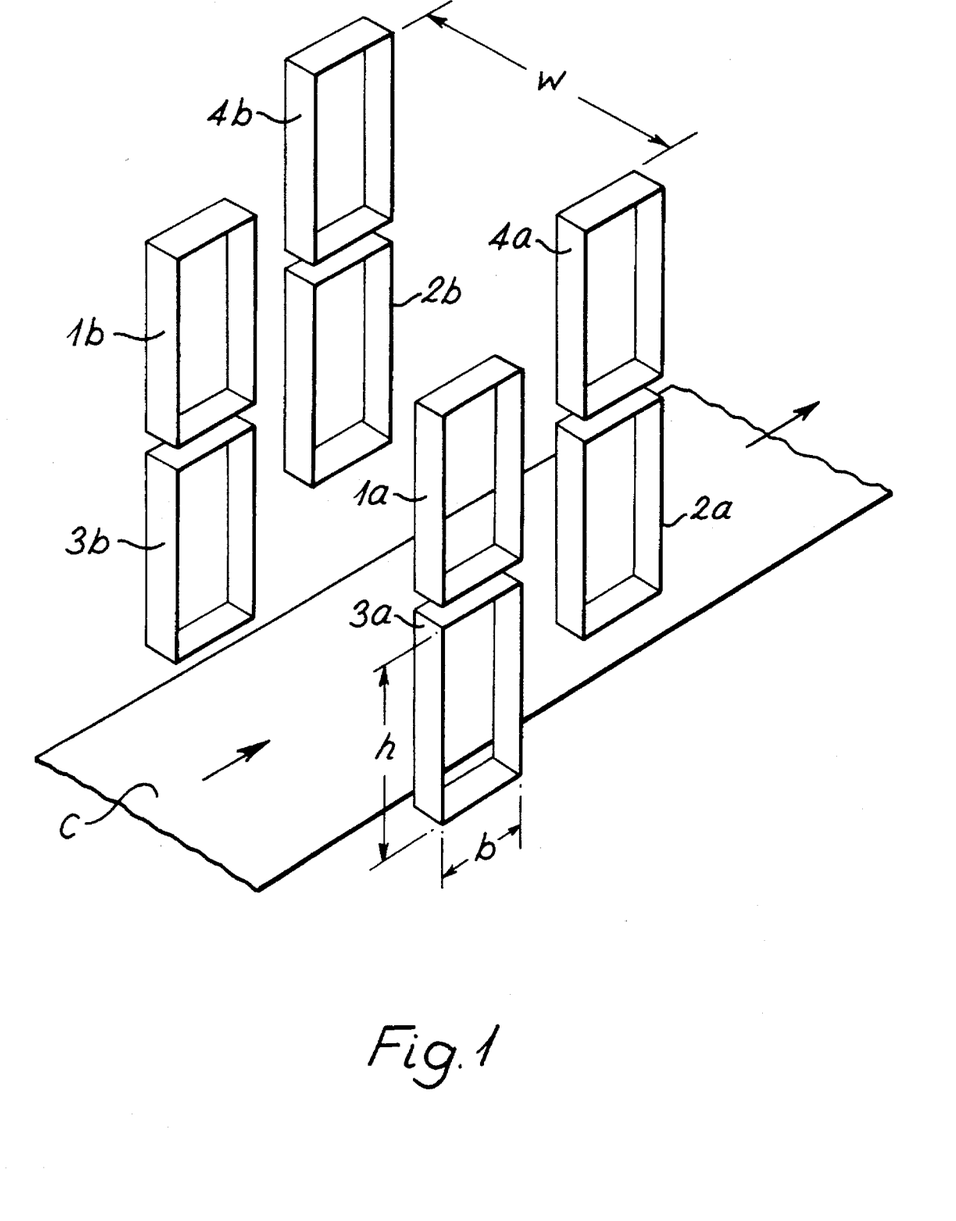
FIG. 1 is a perspective sketch showing an arrangement of two coil arrays adjacent to a conveyor belt.

FIG. 1 shows a conveyor belt, represented diagrammatically as a strip C with arrows to show its direction of motion, which is arranged to carry articles (not shown) continuously or intermittently for examination between two arrays of coils. The coils are shown diagrammatically as rectangular frames 1a to 4b of width b and height h. The coils, 1a, 3a, 2a and 4a are arranged in two columns in a vertical plane above the nearer edge of the conveyor belt C. Coils 1b, 3b, 2b and 4b are correspondingly arranged in a vertical plane above the further edge of the conveyor belt. The coils 2a, 4a, 2b, 4b are mounted at a height such that any part of an article which passes adjacent to the abutment or edges of the coils 1a, 3a, 1b, 3b will pass between the centers of coils 2a, 2b or 4a, 4b. The spacing between the arrays of coils is indicated as dimension w.

The particular physical design of the coils will depend on the frequency or frequencies to be used, which will depend on the substance or substances to be detected. They are mounted on formers and supports (not shown) of a low loss insulating material which will not show any confusing resonances from any quadrupolar nuclei. To avoid undesirable and illegal stray radiation the whole apparatus of FIG. 1 will be used within a screened room or a tunnel-like enclosure lined with copper or aluminum foil (not shown).

Figure 2:
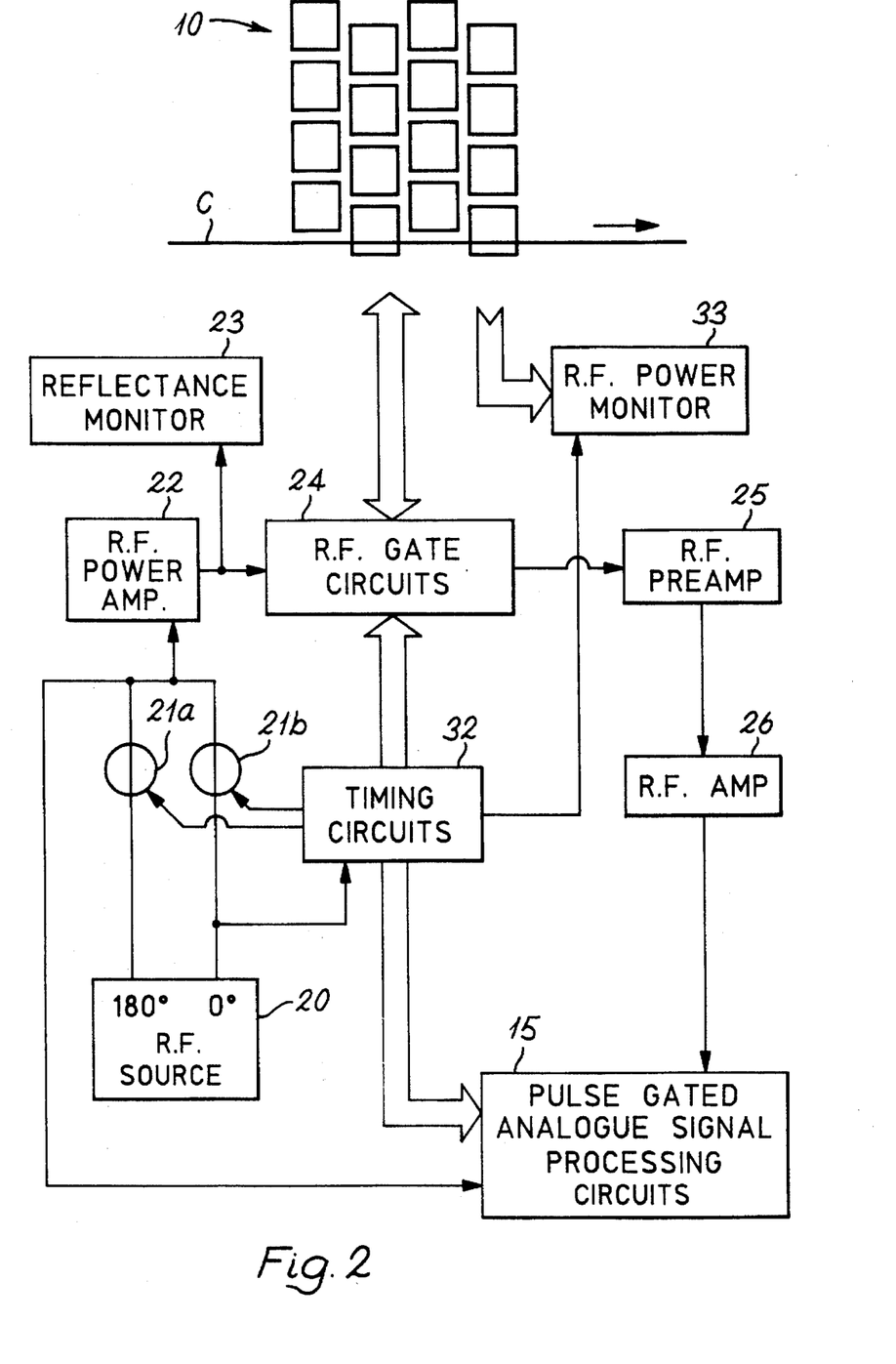
FIG. 2 is a block circuit diagram of apparatus as used for measuring f.i.d. responses with a relatively long cycle time.

FIG. 2 is a block diagram of electrical apparatus suitable for the simpler form of the invention in which f.i.d. signals are measured. At the top of the diagram is a diagrammatic side elevation of the conveyor belt C and an array of coils or coil pairs 10. In this case fourteen coils or coil pairs are shown arranged in four columns but any number of coils may be used in this form of the invention. A radio frequency source 20 has two outputs arranged to provide the same frequency signal with phasing indicated by the annotations 0° and 180°. These outputs are connected through circuits 21a and 21b respectively to a radio frequency power amplifier 22. The amplifier output is connected to a reflectance monitor 23 and through r.f. gate circuits 24 to the coils 10. During the sampling periods the r.f. gate circuits 24 connect the coil pairs through an r.f. pre-amplifier 25 and r.f. amplifier 26 to pulse gated analog-signal processing circuits 15.

Timing circuits 32 are connected to receive a reference signal from the r.f. source 20 and to control the gate circuits 21a, 21b, the r.f. gate circuits 24, the analog-signal processing circuits 15 and an r.f. power monitor 33. This monitor 33 is connected to probes (not shown) adjacent to each of the coils to monitor the irradiation field strengths. The circuits 15 are connected to receive a reference signal from the output connection of gate circuits 21a and 21b.

Figure 3A:
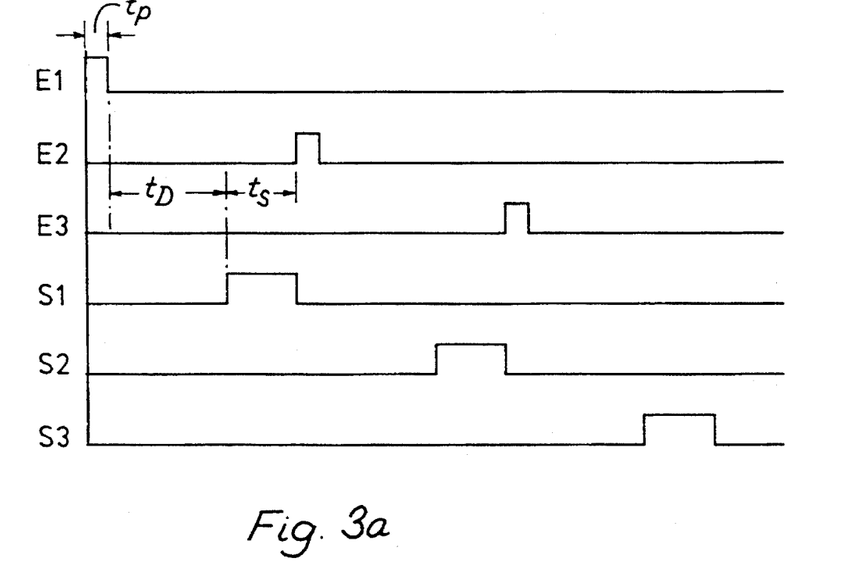
FIGS. 3a and 3b are graphical diagrams illustrating alternative ways of using the apparatus of FIG. 2.

FIG. 3a illustrates one way in which the apparatus of FIG. 2 may be used for sequential tests using each coil or coil pair in turn. Traces E1, E2, E3 represent the amplitudes of rectangular excitation pulses applied to the first, second and third coil pairs respectively, and traces S1, S2, S3 respectively represent signals controlling the sampling periods during which the response signals from these coils are measured. Each excitation pulse has a duration $t_p$ and is followed after a delay $t_D$ by a sampling period $t_s$. Each test made with a particular coil pair is completed in a time $t_p+t_D+t_s$ and if there are n coil pairs a full cycle of tests is completed in a cycle time given by $n(t_p+t_D+t_s)$. Typical values will be $t_p$=40 µs, $t_D$=200 µs, $t_s$=120 µs and if n=14 the cycle time may be 5.04 milliseconds.

Figure 3B:
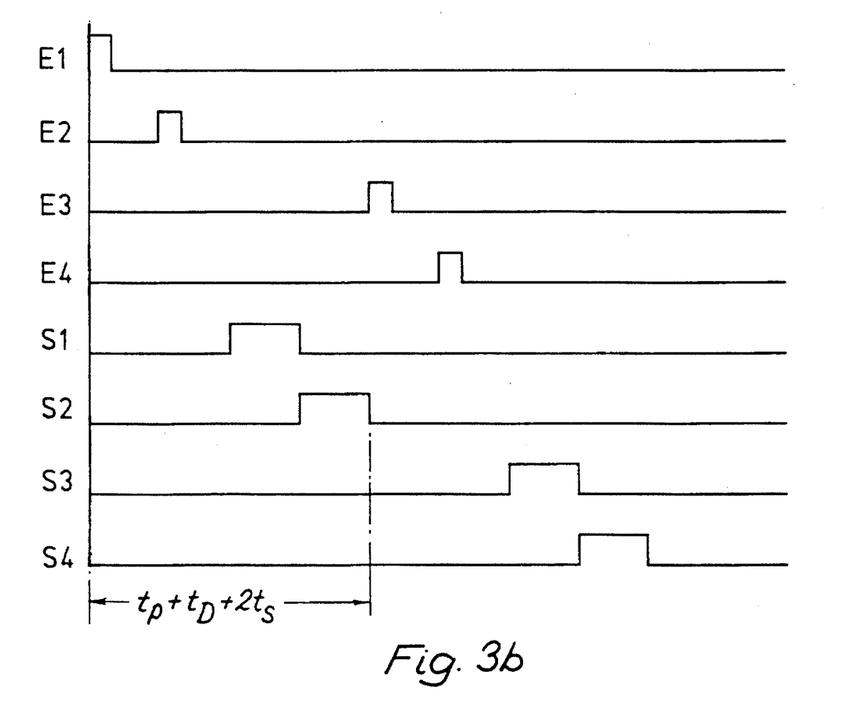

FIG. 3b illustrates an alternative arrangement in which the tests are interleaved. Traces E1 to E4 represent excitation signals applied to the first to fourth coil pairs and traces S1 to S4 represent the corresponding sampling control signals. Even-numbered coil pairs are energized in the delay periods following the excitation of the odd-numbered coil pairs, and thus tests with two coils are completed in a time $t_p+t_D+2t_s$. A full cycle is completed in a time $n(t_p+t_D+2t_s)/2$ and with the typical values given this may be 3.36 milliseconds. In some experiments the cycle time has been reduced to 2 milliseconds with satisfactory results.

The gates 21a and 21b will be opened in alternate cycles and the analog-signal processing circuits 15 will be arranged to perform the functions of phase-sensitive detection, ring-down signal cancellation and summation of the response signals from many cycles which will be more fully explained with reference to the circuits of FIG. 4.

Figure 4:
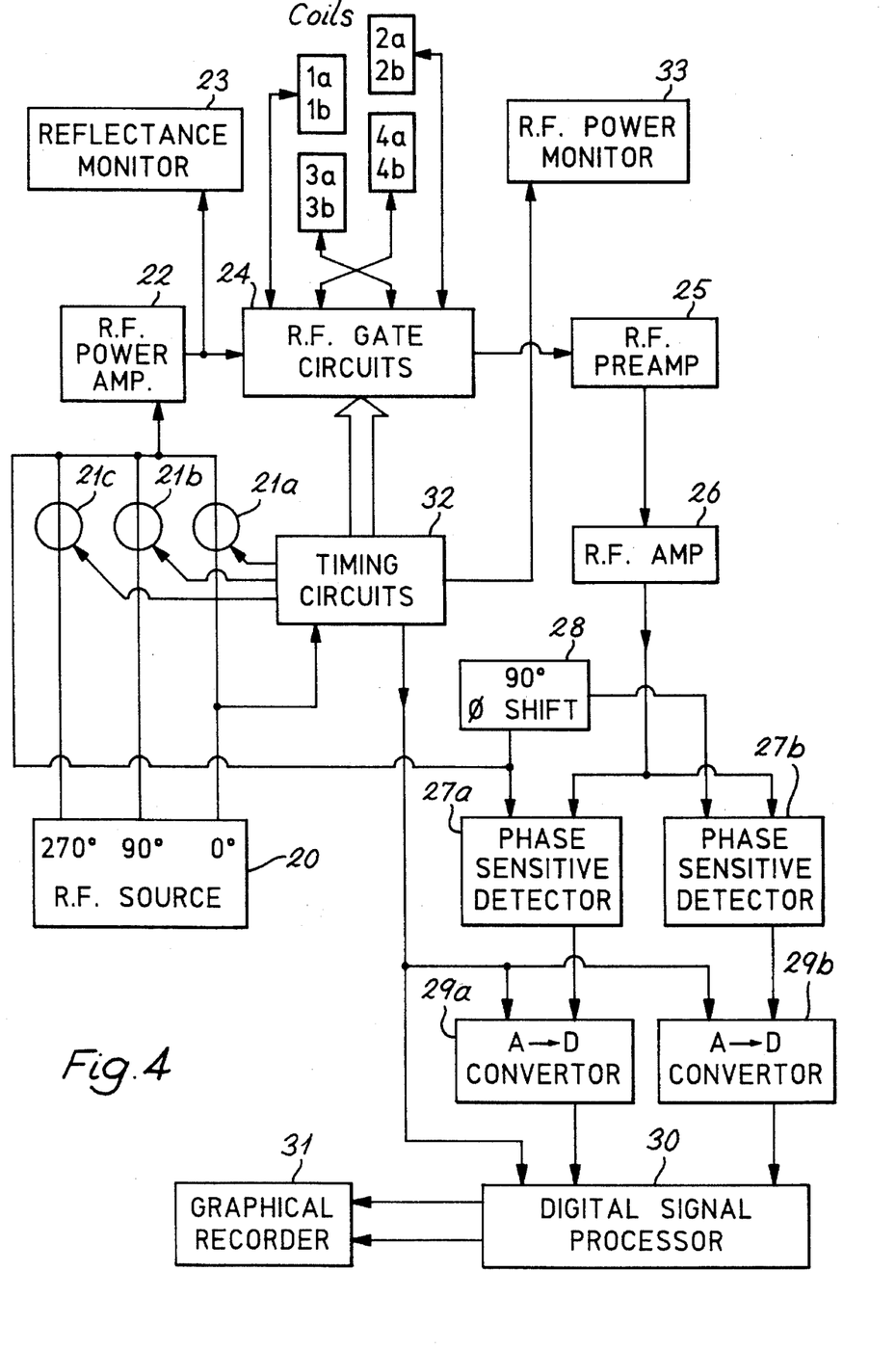
FIG. 4 is a block circuit diagram of apparatus as used for measuring spin echo responses with a relatively short cycle time.

FIG. 4 shows an arrangement of circuits which may be used to measure spin-echo signals with a relatively short cycle time. In this case the r.f. source 20 has three outputs to provide signals with relative phasing as indicated by the annotations 0°, 90°, 270° and there are three gate circuits 21a, 21b and 21c which connect these outputs to the r.f. power amplifier. The coil pairs 1a, 1b to 4a, 4b are arranged as shown in FIG. 1 and the number of coil pairs which may be used will be limited by constraints on the cycle time. During the sampling periods the gate circuits 24 will connect the coils to a detecting and measuring circuit which comprises units 25 to 30 inclusive. In the sampling periods signals from the coils 1a to 4b are passed through the r.f. gate circuits 24, a low-noise r.f. pre-amplifier 25 and an r.f. amplifier 26 to a pair of phase sensitive detector circuits 27a and 27b. The output of the gate circuits 21a, 21b and 21c is connected as a reference signal directly to the p.s.d. circuit 27a and through a 90° phase shifting circuit 28 to the other p.s.d. circuit 27b. Outputs of the p.s.d. circuits 27a and 27b are applied through fast-sampling analog-to-digital converters 29a and 29b to a digital signal processor unit 30. Outputs from this processor unit 30 are connected to a graphical recorder 31.

Timing circuits 32 receive the reference-phase output of the r.f. source 20 and are arranged to control the gate circuits 21a, 21b, 21c and 24, the fast-sampling converter circuits 29a and 29b, the digital data processor 30 and an r.f. power monitor 33. A number of small r.f. probe pick-up coils, adjacent to each of the coils 1a to 4b but not shown on the diagram for the sake of clarity, are connected to the r.f. power monitor 33, to monitor the actual r.f. field developed by each excitation pulse and thereby show any fault or any malfunction which could be caused by conducting or ferromagnetic material or electrical circuits present within an article which is being tested.

The coils are generally used in pairs; for example coils 1a and 1b will be energized simultaneously in phase so as to assist in producing a fairly uniform field strength throughout the space between them. However, a switch (not shown) is provided to allow either the array 1a to 4a or the array 1b to 4b to be used separately; such tests will indicate if a detected substance is present towards either side of the article tested.

Figure 7:
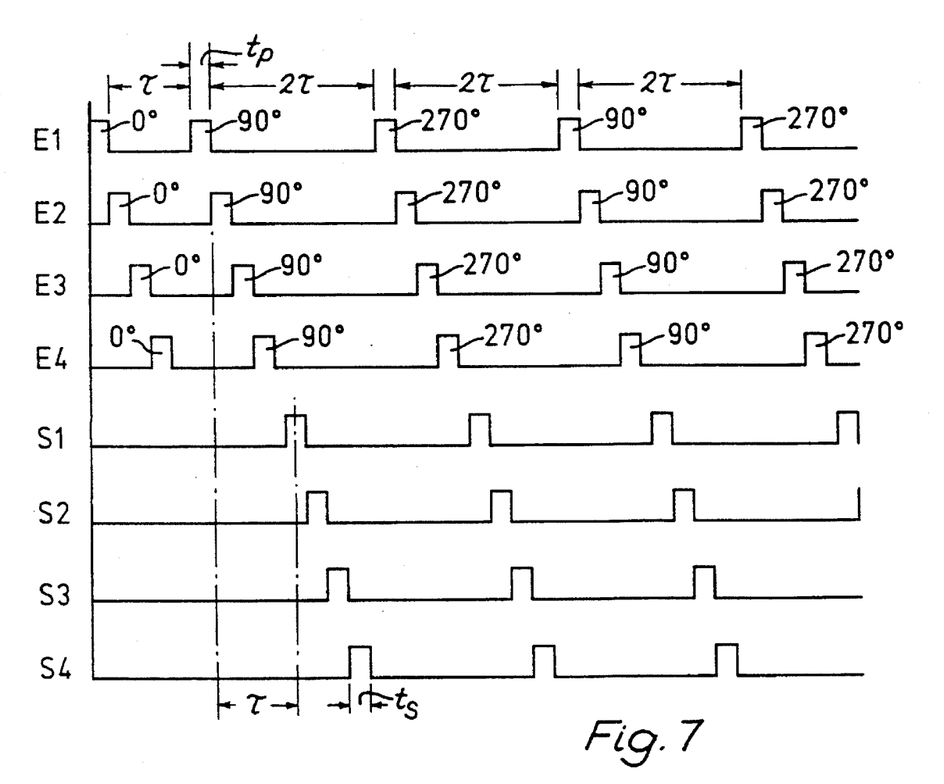
FIG. 7 is a graphical representation of signals used in the apparatus of FIGS. 1 and 4.

FIG. 7 illustrates a typical sequence of operations for the apparatus of FIG. 4 and FIG. 1. Traces $E_1$ to $E_4$ represent the excitation pulses applied to the coil pairs 1a and 1b, 2a and 2b, 3a and 3b and 4a and 4b respectively. Traces S1 to S4 respectively represent the sampling period control signals for the coil pairs. In the preferred sequence shown there is a preparatory cycle of duration $\tau+t_p$ without sampling signals, but in subsequent cycles of duration $2\tau+t_p$ each sequence of coil pair excitations is followed by a sequence of sampling periods and a full set of tests is completed in the time $2\tau$. Each spin echo response will peak at time $\tau$ after the preceding excitation pulse applied to the same coil and the sampling periods are centered on these times. The phase of the radio frequency signals is selected as indicated by the annotations 0°, 90°, 270° shown against the pulses. Each coil pair is energized by a series of pulses beginning with a first pulse of reference phase 0°, followed after a time $\tau$ by the first of two sets of excitation pulses. These excitation pulses occur at intervals of $2\tau$ and are alternately of phase 90° and phase 270°; the 90° phase pulses form one set, and the 270° phase pulses form the other set.

In the preferred arrangement shown the reference signals for the phase sensitive detectors 27a and 27b are taken from the output of the gates 21 and are therefore in phase with the residual ring-down signals. In the digital signal processor 30 the responses measured after the 270° pulses are subtracted from the responses measured after the 90° pulses. This cancels out the ring-down signals but the spin-echo responses are added cumulatively by this procedure. The same effect could be produced by always taking the p.s.d. reference signals directly from one or two of the outputs of the r.f. source 20 and adding all the response signals, but care should be taken to see that stray phase shifts do not detract from the cancellation effect.

To avoid any transients resulting from the connection each sampling period $t_s$ begins shortly after the connection is made. Many samples are taken and digitized in each sampling period. Each test is continued for many cycles, and samples which are digitized at corresponding times in each cycle are summed together. The results stored in the digital data processor therefore comprise four sets of signals each set representing the average or accumulated responses received from one of the coil pairs in a sampling period.

For the detection of the explosive RDX a suitable resonant-frequency is about 5.191 MHz; r.f. drive signals having a power spectrum of width 18 KHz at half height may be used to allow for the effects of ±120° C. temperature variations. The r.f. power required for an array as in FIG. 1 with w=25 cm is about 60 KW. The pulse timing and intervals may be set as follows:

excitation pulse length $t_p$=40 µs, peak r.f. field strength approximately 1.1 millitesla (11 gauss), interval $\tau=175$ µs, cycle time $2\tau=350$ µs, sampling period $t_s=40$ µs, sampling rate 1 MHz. Appropriate frequencies for detecting HMX and TNT are 5.303 MHz and 0.875 MHz respectively.

While the traces of FIG. 7 show a preferred form of pulse sequence, many other forms of pulse sequence Known in NQR or NMR studies can alternatively be used.

Figure 8:
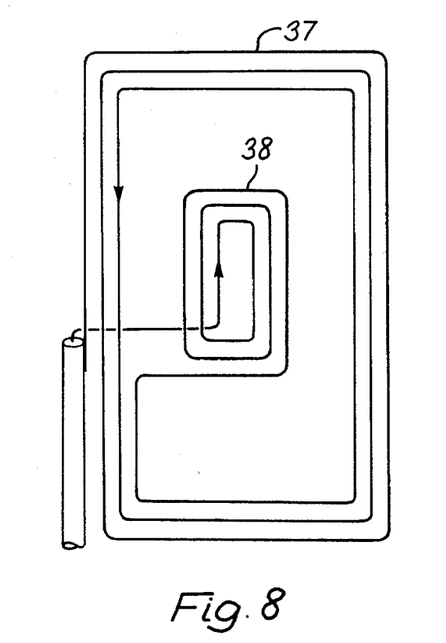
FIG. 8 is a diagrammatic drawing of a coil with inner and outer turns.

FIG. 8 shows diagrammatically an alternative form of coil which may be used to achieve more uniform irradiation and hence more uniform sensitivity over the thickness of the articles being examined. This has a number of outer turns 37 and a number of inner turns 38, connected so that the field of the inner turns opposes the field of the outer turns. This gives a fairly uniform field extending over a relatively greater distance from the plane of the coil. While the two parts of the coil are drawn as spirals in FIG. 3 they could alternatively be short solenoids or annular coils.

The sequencing of the coil connections is preferably arranged so that consecutively connected coils are not immediately adjacent to each other, to minimize any cross-coupling which could cause misleading results. This is easier to arrange if the time $\tau$ can be longer in relation to the pulse duration $t_p$ so as to allow more than four coils to be used. For instance $t_p$ could be 35 µs and $\tau=200$ µs for the five-coil arrays of FIGS. 5 and 6. Alternatively, as indicated in FIGS. 1 and 2, the second column of coils in each array may be slightly separated from the first column and if necessary an earthed conductive strip (not shown) could be placed between the columns to minimize cross-coupling.

Figure 5:
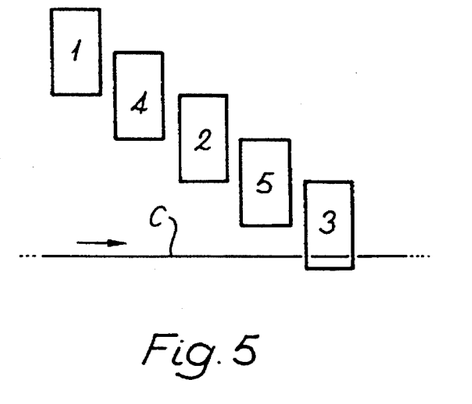
FIGS. 5 and 6 are diagrammatic side views of alternative arrangements of coil arrays.
Figure 6:
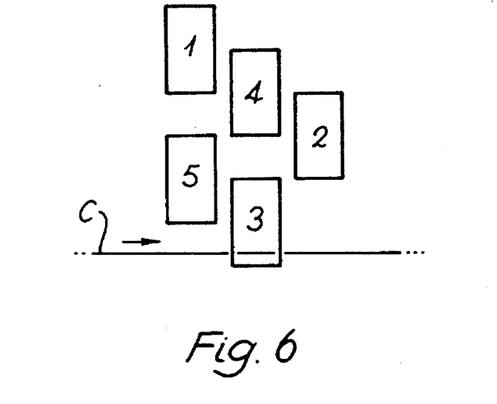

FIG. 5 shows a side view of an alternative form of array with five coil pairs in a diagonal arrangement. For greater compactness this can be rearranged into the form shown in FIG. 6, where the two lowest coil pairs are displaced to positions under the two highest coil pairs. The coil pairs in these arrays can be energized in the sequence indicated by the numbers 1 to 5, so that consecutively connected coils are not adjacent to each other.

Figure 9:
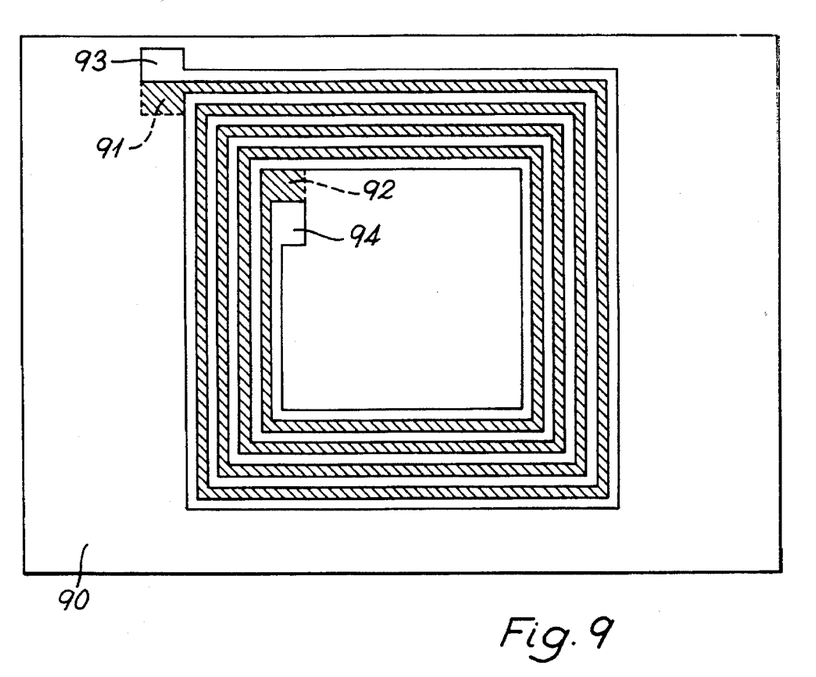
FIG. 9 is a side elevation of another useful form of coil.

FIG. 9 shows a suitable construction for one of the coils. This has two windings, electrically connected in parallel, formed by photo-etching copper coatings on both sides of an insulating board 90. The windings are formed as square spirals; the shaded part extending from 91 to 92 represents the winding on the rear side of the board, and the clear structure from 93 to 94 represents the winding on the front of the board.

It will of course be understood that the present invention has been described purely by way of example, and modifications of detail can be made within the scope of the invention.

We claim:

1. A method of detecting the presence of selected nuclei in an article, including providing an array of excitation devices, causing relative motion between the article and the array in a given direction, and applying excitation pulses to the article via the array to excite the selected nuclei to resonance and detecting via the array the resonance responses thus excited, the excitation devices in the array being disposed such that if viewed in the given direction they would appear to overlap one another.

2. A method according to claim 1 wherein the excitation devices are arranged in at least two columns, the devices of alternate columns being displaced, whereby any part of an article which passes adjacent to the edges or abutment of two such devices in one column can pass adjacent to the center of such a device in the next column.

3. A method according to claim 1 wherein the excitation devices are disposed in a diagonal or staggered array.

4. A method according to claim 1 wherein two identical spatially opposed arrays of excitation devices are provided, and wherein corresponding devices of both arrays are used simultaneously.

5. A method according to claim 4 wherein the excitation devices of each array are additionally used separately, whereby it can be determined if the selected nuclei are present towards either side of the article.

6. A method according to claim 1 wherein the excitation pulses are applied to the excitation devices such that successively excited devices are not immediately adjacent to each other.

7. A method according to claim 1 wherein in one half of the excitation pulses the phase of the excitation is substantially inverted with respect to the phase of the excitation in the other half of the pulses.

8. A method according to claim 1 wherein the loading of the excitation devices is monitored to detect the presence of electrically conducting or ferromagnetic material.

9. Apparatus for detecting the presence of selected nuclei in an article, comprising an array of excitation devices, means for causing relative motion between the article and the array in a given direction, and means for applying excitation pulses to the article via the array to excite the selected nuclei to resonance and for detecting via the array the resonance responses thus excited, the excitation devices in the array being disposed such that if viewed in the given direction they would appear to overlap one another.

10. Apparatus according to claim 9 wherein the excitation devices are arranged in at least two columns, the devices of alternate columns being displaced, whereby any part of an article which passes adjacent to the edges or abutment of two such devices in one column can pass adjacent to the center of such a device in the next column.

11. Apparatus according to claim 9 wherein the excitation devices are disposed in a diagonal or staggered array.

12. Apparatus according to claim 9 wherein two identical spatially opposed arrays of excitation devices are provided, and wherein corresponding devices of both arrays are adapted to be used simultaneously.

13. Apparatus according to claim 12 wherein the excitation devices of each array are additionally adapted to be used separately, whereby it can be determined if the selected nuclei are present towards either side of the article.

14. Apparatus according to claim 9 wherein each excitation device is a coil having some outer turns enclosing a relatively large area and some inner turns enclosing a concentric relatively small area, connected so that the field of the inner turns opposes the field of the outer turns.

15. Apparatus according to claim 9 wherein each excitation device is a coil having two spiral windings mounted on opposite sides of a planar insulating board and electrically connected in parallel.

16. Apparatus according to claim 15 wherein the two spiral windings of each coil are relatively placed so that in a side view one spiral winding would appear to lie between the turns of the other spiral winding.

17. Apparatus according to claim 9 wherein two identical spatially opposed arrays of excitation devices are provided, and wherein one of the arrays is movable or removable.

18. Apparatus according to claim 9 wherein the excitation pulse applying means is arranged to apply the excitation pulses to the excitation devices such that successively excited devices are not immediately adjacent to each other.

19. Apparatus according to claim 9 wherein the excitation pulse applying means is arranged to apply the excitation pulses such that in one half of the pulses the phase of the excitation is substantially inverted with respect to the phase of the excitation in the other half of the pulses.

20. Apparatus according to claim 9 wherein the means for causing relative motion is adapted to convey the article in an intermittent motion or a slow continuous motion.

21. A method of detecting the presence of selected nuclei in an article, including providing a plurality of excitation devices, applying a respective sequence of excitation pulses to the article via each such device to excite the selected nuclei to resonance, and detecting in sampling periods the resonance responses thus excited, the sequences of pulses being interleaved with one another such that a later pulse applied via a given excitation device occurs in the interval between an earlier pulse applied via a different such excitation device and the sampling period for detection of the response due to that earlier pulse.

22. A method according to claim 21 wherein the response due to the earlier pulse is a free induction decay response.

23. A method according to claim 21 wherein the response due to the earlier pulse is a spin-echo response.

24. A method according to claim 21 wherein the excitation pulses are applied to the excitation devices such that successively excited devices are not immediately adjacent to each other.

25. A method according to claim 21 wherein the excitation pulses are applied to the excitation devices, and the resonance responses detected therefrom, in cyclic succession, a plurality of cycles being employed.

26. A method according to claim 21 wherein in one half of the excitation pulses the phase of the excitation is substantially inverted with respect to the phase of the excitation in the other half of the pulses.

27. A method according to claim 21 wherein the loading of the excitation devices is monitored to detect the presence of electrically conducting or ferromagnetic material.

28. Apparatus for detecting the presence of selected nuclei in an article, comprising a plurality of excitation devices, means for applying a respective sequence of excitation pulses to the article via each such device to excite the selected nuclei to resonance, and means for detecting in sampling periods the resonance responses thus excited, the sequences of pulses being arranged to be interleaved with one another such that a later pulse applied via a given excitation device occurs in the interval between an earlier pulse applied via a different such excitation device and the sampling period for detection of the response due to that earlier pulse.

29. Apparatus according to claim 28 wherein two identical spatially opposed arrays of excitation devices are provided, and wherein corresponding devices of both arrays are adapted to be used simultaneously.

30. Apparatus according to claim 29 wherein the excitation devices of each array are additionally adapted to be used separately, whereby it can be determined if the selected nuclei are present towards either side of the article.

31. Apparatus according to claim 28 wherein two identical spatially opposed arrays of excitation devices are provided, and wherein one of the arrays is movable or removable.

32. Apparatus according to claim 28 wherein each excitation device is a coil having some outer turns enclosing a relatively large area and some inner turns enclosing a concentric relatively small area, connected so that the field of the inner turns opposes the field of the outer turns.

33. Apparatus according to claim 28 wherein each excitation device is a coil having two spiral windings mounted on opposite sides of a planar insulating board and electrically connected in parallel.

34. Apparatus according to claim 33 wherein the two spiral windings of each coil are relatively placed so that in a side view one spiral winding would appear to lie between the turns of the other spiral winding.

35. Apparatus according to claim 28 wherein the excitation pulse applying means is arranged to apply the excitation pulses to the excitation devices such that successively excited devices are not immediately adjacent to each other.

36. Apparatus according to claim 28 wherein the excitation pulse applying means is arranged to apply the excitation pulses such that in one half of the pulses the phase of the excitation is substantially inverted with respect to the phase of the excitation in the other half of the pulses.

37. Apparatus according to claim 28 including means for conveying the article in an intermittent motion or a slow continuous motion.

* * * * *

UNITED STATES PATENT AND TRADEMARK OFFICE
CERTIFICATE OF CORRECTION

PATENT NO.   : 5,457,385

DATED        : October 10, 1995

INVENTOR(S)  : Smith et al.

It is certified that error appears in the above-identified patent and that said Letters Patent is hereby corrected as shown below:

ON THE TITLE PAGE:

[75]    Inventors:

"John A. Sydney," should be
        --John A.S. Smith,--.

Signed and Sealed this

Second Day of January, 1996

Attest:

BRUCE LEHMAN

*Attesting Officer*    *Commissioner of Patents and Trademarks*